(12) United States Patent
Kolodny et al.

(10) Patent No.: US 10,521,237 B2
(45) Date of Patent: Dec. 31, 2019

(54) MEMRISTOR BASED MULTITHREADING (71) Applicant: Technion Research and Development Foundation LTD., Haifa (IL)

(72) Inventors: Avinoam Kolodny, Haifa (IL); Uri Weiser, Tel Aviv (IL); Shahar Kvatinsky, Ramat Gan (IL)

(73) Assignee: TECHNION RESEARCH AND DEVELOPMENT FOUNDATION LTD, Haifa (IL)

( * ) Notice: Subject to any disclaimer, the term of this patent is extended or adjusted under 35 U.S.C. 154(b) by 1185 days.

(21) Appl. No.: 14/219,030

(22) Filed: Mar. 19, 2014

(65) Prior Publication Data

US 2014/0325192 A1 Oct. 30, 2014

(51) Int. Cl.
G06F 9/38 (2018.01)
G06F 9/30 (2018.01)
H01L 45/00 (2006.01)
G06F 9/46 (2006.01)

(52) U.S. Cl.
CPC ........ G06F 9/3867 (2013.01); G06F 9/30105 (2013.01); *G06F 9/30123* (2013.01); *G06F 9/3851* (2013.01); *G06F 9/3869* (2013.01); *G06F 9/461* (2013.01); *H01L 45/04* (2013.01)

(58) Field of Classification Search
CPC .............. G06F 9/3867; G06F 9/30105; G06F 9/30123; G06F 9/3869; G06F 9/3851; G06F 9/461; H01L 45/04
USPC .................................. 712/219, 228; 718/108
See application file for complete search history.

(56) References Cited

U.S. PATENT DOCUMENTS

| 2003/0093655 A1* | 5/2003 | Gosior | G06F 9/30145 |
| | | | 712/228 |
| 2009/0172362 A1* | 7/2009 | Shen | G06F 9/3851 |
| | | | 712/220 |
| 2012/0014169 A1* | 1/2012 | Snider | G11C 5/141 |
| | | | 365/148 |
| 2012/0254541 A1* | 10/2012 | Beckmann | G06F 12/0806 |
| | | | 711/122 |

OTHER PUBLICATIONS

R. Gabor, S. Weiss, and A. Mendelson, "Fairness Enforcement is Switch on Event Multithreading," ACM Transactions on Architecture and Code Optimization, vol. 4, No. 3, Article 15, pp. 1-34, Sep. 2007.

(Continued)

*Primary Examiner* — Daniel H Pan
(74) *Attorney, Agent, or Firm* — Reches Patents (57) ABSTRACT

A method and a device that includes a set of multiple pipeline stages, wherein the set of multiple pipeline stages is arranged to execute a first thread of instructions; multiple memristor based registers that are arranged to store a state of another thread of instructions that differs from the first thread of instructions; and a control circuit that is arranged to control a thread switch between the first thread of instructions and the other thread of instructions by controlling a storage of a state of the first thread of instructions at the multiple memristor based registers and by controlling a provision of the state of the other thread of instructions by the set of multiple pipeline stages; wherein the set of multiple pipeline stages is arranged to execute the other thread of instructions upon a reception of the state of the other thread of instructions.

4 Claims, 8 Drawing Sheets

(56) References Cited

OTHER PUBLICATIONS

J. M. Borkenhagen, R. J. Eickemeyer, R. N. Kalla, and S. R. Kunkel, "A Multithreaded PowerPC Processor for Commercial Servers," IBM Journal of Research and Development, vol. 44, No. 6, pp. 885-898, Nov. 2000.
C. McNairy and R. Bhatia, "Montecito—The Next Product in the Itanium Processor Family," Hot Chips 16, Aug. 2004.
B. J. Smith, "Architecture and Applications of the HEP Multiprocessor Computer System," Proceedings of SPIE Real Time Signal Processing IV, pp. 241-248, 1981.
L. Gwennap, "Sandy Bridge Spans Generations," Microprocessor Report (www.MPRonline.com), Sep. 2010.
R. Waser and M. Aono, "Nanoionics-based Resistive Switching Memories," Nature Materials, vol. 6, pp. 833-840, Nov. 2007.
Y. Huai, "Spin-Transfer Torque MRAM (STT-MRAM) Challenges and Prospects," AAPPS Bulletin, vol. 18, No. 6, pp. 33-40, Dec. 2008.
L. O. Chua, "Memristor—the Missing Circuit Element," IEEE Transactions on Circuit Theory, vol. 18, No. 5, pp. 507-519, Sep. 1971.
R. Waser, R. Dittmann, G. Staikov, and K. Szot, "Redox-Based Resistive Switching Memories—Nanoionic Mechanisms, Prospects, and Challenges," Advanced Materials, vol. 21, No. 25-26, pp. 2632-2663, Jul. 2009.
B. C. Lee, E. Ipek, O. Mutlu, and D. Burger, "Architecting Phase Change Memory as a Scalable DRAM Alternative," Proceedings of the Annual International Symposium on Computer Architecture, pp. 2-13, Jun. 2009.
M. N. Kozicki and W. C. West, "Programmable Metallization Cell Structure and Method of Making Same," U.S. Pat. No. 5,761,115, Jun. 1998.
J. F. Scott and C. A. Paz de Araujo, "Ferroelectric Memories," Science, vol. 246, No. 4936, pp. 1400-1405, Dec. 1989.
Z. Diao et al, "Spin-Transfer Torque Switching in Magnetic Tunnel Junctions and Spin-Transfer Torque Random Access Memory," Journal of Physics: Condensed Matter, vol. 19, No. 16, pp. 1-13, 165209, Apr. 2007.
International Technology Roadmap for Semiconductor (ITRS), 2009.
A. C. Torrezan, J. P. Strachan, G. Medeiros-Riveiro, and R. S. Williams, "Sub-Nanosecond Switching of a Tantalum Oxide Memristor," Nanotechnology, vol. 22, No. 48, pp. 1-7, Dec. 2011.
J. Nickel, "Memristor Materials Engineering: From Flash Replacement Towards a Universal Memory," Proceedings of the IEEE International Electron Devices Meeting, Dec. 2011.
Z. Guz, E. Bolotin, I. Keidar, A. Kolodny, A. Mendelson, and U. C. Weiser, "Many-Core vs. Many-Thread Machines: Stay Away From the Valley," Computer Architecture Letters, vol. 8, No. 1, pp. 25-28, May 2009.
D. M. Tullsen, S. J. Eggers, and H. M. Levy, "Simultaneous Multithreading: Maximizing On-Chip Parallelism," Proceedings of the Annual International Symposium on Computer Architecture, pp. 392-403, Jun. 1995.
J. W. Haskins, K. R. Hirst, and K. Skadron, "Inexpensive Throughput Enhancement in Small-Scale Embedded Microprocessors with Block Multithreading: Extensions, Characterization, and Tradeoffs," Proceedings of the IEEE International Conference on Performance, Computing, and Communications, pp. 319-328, Apr. 2001.
M. K. Farrens and A. R. Pleszkun, "Strategies for Achieving Improved Processor Throughput," Proceedings of the Annual International Symposium on Computer Architecture, pp. 362-369, May 1991.

* cited by examiner

MEMRISTOR BASED MULTITHREADING

BACKGROUND

The following references illustrate the state of the art:
[1] R. Gabor, S. Weiss, and A. Mendelson, "Fairness Enforcement is Switch On Event Multithreading," ACM Transactions on Architecture and Code Optimization, Vol. 4, No. 3, Article 15, pp. 1-34, September 2007.
[2] J. M. Borkenhagen, R. J. Eickemeyer, R. N. Kalla, and S. R. Kunkel, "A Multithreaded PowerPC Processor for Commercial Servers," IBM Journal of Research and Development, Vol. 44, No. 6, pp. 885-898, November 2000.
[3] C. McNairy and R. Bhatia, "Montecito—The Next Product in the Itanium Processor Family," Hot Chips 16, August 2004.
[4] B. J. Smith, "Architecture and Applications of the HEP Multiprocessor Computer System," Proceedings of SPIE Real Time Signal Processing IV, pp. 241-248, 1981.
[5] L. Gwennap, "Sandy Bridge Spans Generations," Microprocessor Report (www.MPRonline.com), September 2010.
[6] R. Waser and M. Aono, "Nanoionics-based Resistive Switching Memories," Nature Materials, Vol. 6, pp. 833-840, November 2007.
[7] Y. Huai, "Spin-Transfer Torque MRAM (STT-MRAM) Challenges and Prospects," AAPPS Bulletin, Vol. 18, No. 6, pp. 33-40, December 2008.
[8] L. O. Chua, "Memristor the Missing Circuit Element," IEEE Transactions on Circuit Theory, Vol. 18, No. 5, pp. 507-519, September 1971.
[9] R. Waser, R. Dittmann, G. Staikov, and K. Szot, "Redox-Based Resistive Switching Memories Nanoionic Mechanisms, Prospects, and Challenges," Advanced Materials, Vol. 21, No. 25-26, pp. 2632-2663, July 2009.
[10] B. C. Lee, E. Ipek, O. Mutlu, and D. Burger, "Architecting Phase Change Memory as a Scalable DRAM Alternative," Proceedings of the Annual International Symposium on Computer Architecture, pp. 2-13, June 2009.
[11] M. N. Kozicki and W. C. West, "Programmable Metallization Cell Structure and Method of Making Same," U.S. Pat. No. 5,761,115, June 1998.
[12] J. F. Scott and C. A. Paz de Araujo, "Ferroelectric Memories," Science, Vol. 246, No. 4936, pp. 1400-1405, December 1989.
[13] Z. Diao et al, "Spin-Transfer Torque Switching in Magnetic Tunnel Junctions and Spin-Transfer Torque Random Access Memory," Journal Of Physics: Condensed Matter, Vol. 19, No. 16, pp. 1-13, 165209, April 2007.
[14] International Technology Roadmap for Semiconductor (ITRS), 2009.
[15] A. C. Torrezan, J. P. Strachan, G. Medeiros-Riveiro, and R. S. Williams, "Sub-Nanosecond Switching of a Tantalum Oxide Memristor," Nanotechnology, Vol. 22, No. 48, pp. 1-7, December 2011.
[16] J. Nickel, "Memristor Materials Engineering: From Flash Replacement Towards a Universal Memory," Proceedings of the IEEE International Electron Devices Meeting, December 2011.
[17] Z. Guz, E. Bolotin, I. Keidar, A. Kolodny, A. Mendelson, and U. C. Weiser, "Many-Core vs. Many-Thread Machines: Stay Away From the Valley," Computer Architecture Letters, Vol. 8, No. 1, pp. 25-28, May 2009.
[18] D. M. Tullsen, S. J. Eggers, and H. M. Levy, "Simultaneous Multithreading: Maximizing On-Chip Parallelism," Proceedings of the Annual International Symposium on Computer Architecture, pp. 392-403, June 1995.
[19] J. W. Haskins, K. R. Hirst, and K. Skadron, "Inexpensive Throughput Enhancement in Small-Scale Embedded Microprocessors with Block Multithreading: Extensions, Characterization, and Tradeoffs," Proceedings of the IEEE International Conference on Performance, Computing, and Communications, pp. 319-328, April 2001.
[20] M. K. Farrens and A. R. Pleszkun, "Strategies for Achieving Improved Processor Throughput," Proceedings of the Annual International Symposium on Computer Architecture, pp. 362-369, May 1991.
[21] The gem5 Simulator. A modular platform for computer-system architecture research.
[22] SPEC CPU2006 benchmark suite.

Multithreading processors have been used to improve performance in a single core for the past two decades. One low power and low complexity multithreading technique is Switch on Event multithreading (SoE MT, also known as coarse grain multithreading and block multithreading) [1], [2], [3], [20], where a thread runs inside the pipeline until an event occurs (e.g., a long latency event like a cache miss) and triggers a thread switch. The state of the replaced thread is maintained by the processor, while the long latency event is handled in the background. While a thread is switched, the in-flight instructions are flushed. The time required to refill the pipeline after a thread switch is referred to as the switch penalty. The switch penalty is usually relatively high, makes SOE MT less popular than simultaneous multithreading (SMT) [18] and fine-grain multithreading (interleaved multithreading) [4]. While fine-grain MT is worthwhile only for a large number of threads, the performance of SMT is limited in practice due to limitations on the number of supported threads (e.g., two for Intel Sandy Bridge [5]).

SUMMARY OF THE INVENTION

According to an embodiment of the invention various methods may be provided and are described in the specification. Additional embodiments of the invention include a device that may be arranged to execute any or all of the methods described in the specification above, including any stages-and any combinations of same.

According to an embodiment of the invention there may be provided a device. The device may include (a) a set of multiple pipeline stages, wherein the set of multiple pipeline stages is arranged to execute a first thread of instructions; (b) multiple memristor based registers that are arranged to store a state of another thread of instructions that differs from the first thread of instructions; and (c) a control circuit that is arranged to control a thread switch between the first thread of instructions and the other thread of instructions by controlling (i) a storage of a state of the first thread of instructions at the multiple memristor based registers and (ii) a provision of the state of the other thread of instructions by the set of multiple pipeline stages. The set of multiple pipeline stages may arranged to execute the other thread of instructions upon a reception of the state of the other thread of instructions. The first thread of instructions may also be referred to an active thread and the other threads may be referred to as inactive threads. When a thread switch occurs the first thread may become a previously active thread and one other thread may become the new active thread.

The memristor based registers may include any resistive memory elements such as but not limited to -spin torque transfer magnetoresistive memory elements or may include resistive memory elements.

The resistive memory elements may be formed in close proximity to the multiple pipeline stages.

The resistive memory elements may be positioned directly above portions of the set of multiple pipeline stages.

The duration of the thread switch may not exceed the period that may take to refill the pipeline. For example, it may not exceed ten, five or three clock cycles of a clock signal provided to the set of multiple pipeline stages.

Each pipeline stage may be followed by a memristor based register.

The storage of the state of the first thread of instructions at the multiple memristor based registers may be preceded by extracting the state of the first thread of instructions from the set of multiple pipeline stages. The aggregate duration of the extracting of the state of the first thread of instructions and the storage of the state of the first thread of instructions may exceeds the duration of the provision of the state of the other thread of instructions.

The multiple memristor based registers may be arranged to store a state of each one out of multiple (n) other thread of instructions that differ from the first thread of instructions; and the control circuit may be arranged to control thread switches between any instructions out of the first thread if instructions and any one of the other threads of instructions.

The number (n) of other (inactive) threads may exceed 2, 3, 5, and 7, 9, 10, 12, 20, 30 and even more.

The multiple memristor based registers may include multiple layers, wherein each layer is dedicated for storing the status of a single other thread of instructions. It is noted that the term layer may refer to any group of memory elements of the memristor based registers and that a single layer may store the status related to multiple threads.

The memristor based registers may include resistive memory elements; and each other thread of instructions is stored in a memristive-based layer of the memristor based registers.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

There is provided a Continuous Flow Multithreading (CFMT), a novel microarchitecture. The primary concept of CFMT is to support SoE MT for a large number of threads through the use of multistate pipeline registers (MPRs). These MPRs store the intermediate state of all instructions of inactive threads, eliminating the need to flush the pipeline on thread switches. This new machine is as simple as a regular SoE MT, and has higher energy efficiency while improving the performance as compared to regular SoE MT.

Hirst et al extends the SoE MT to differential multithreading (dMT) [19], proposing two threads running simultaneously in a single scalar pipeline for low cost microprocessors. CFMT takes a broader view of advanced SoE MT microarchitectures. CFMT extends SoE MT by enabling the use of numerous threads using multistate pipeline registers in deep pipeline machines. CFMT is applicable to any execution event that can cause a pipeline stall.

The development of new memory technologies, such as RRAM (Resistive RAM) [6] and STT-MRAM (Spin-Transfer Torque Magnetoresistive RAM) [7], enables MPRs since these devices are located in metal layers above the logic cells and are fast, dense, and power efficient. These memory technologies are referred to as memristors [8], [9].

Continuous Flow Multithreading (CFMT)

To reduce the thread switch penalty, a new thread switching mechanism for SOE MT is proposed. In CFMT, pipeline registers are replaced by MPRs, as shown in FIG. 1.

Figure 1:
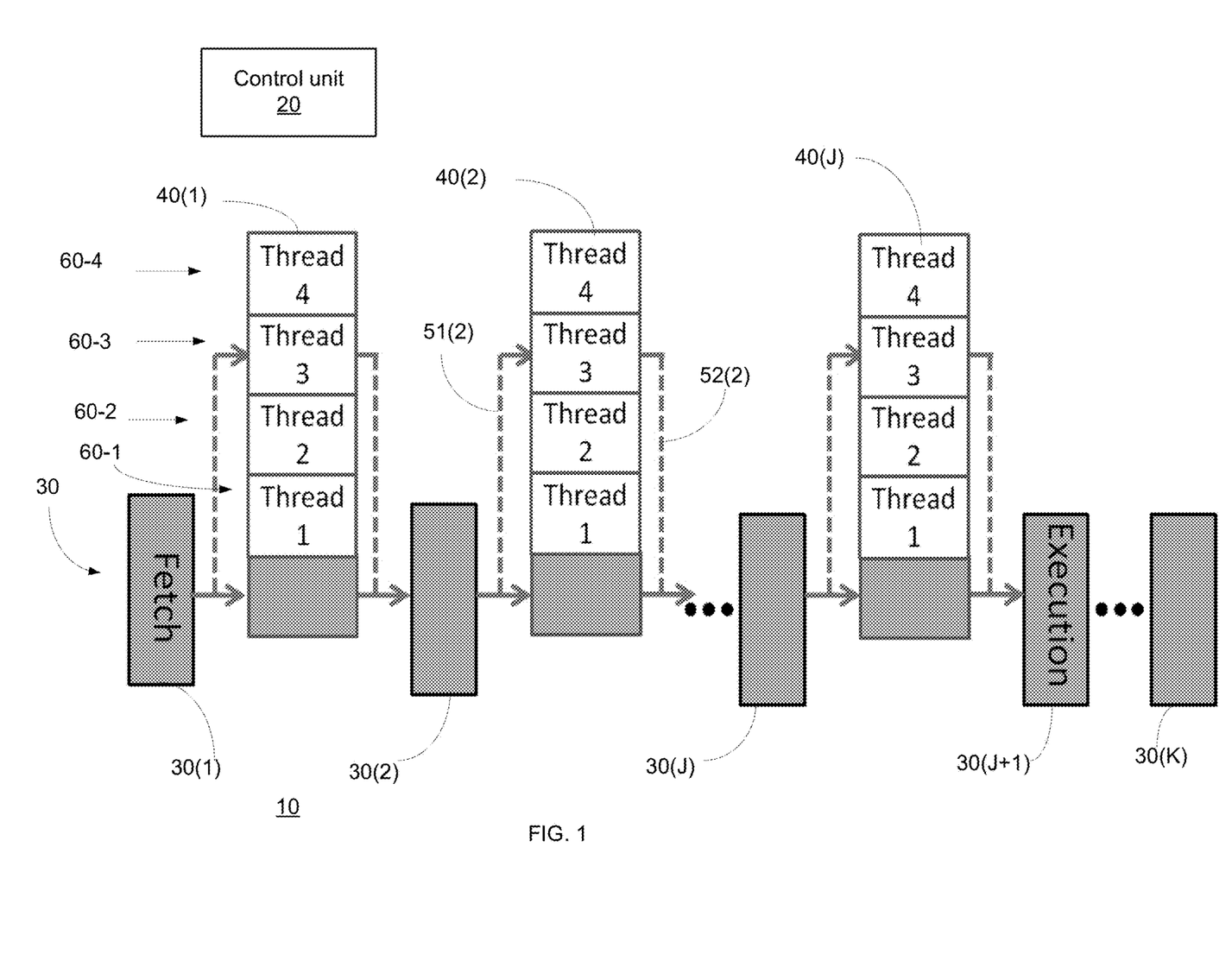
FIG. 1 illustrates a device according to an embodiment of the invention.

In FIG. 1 a set of memristor based registers such as multistate pipeline registers (MPRs) 40(1)-40(J) is located between every two pipeline stages 30(1)-30(J+1). For simplicity of explanation various pipeline registers that are placed after pipeline stages 30(J+1) and 30(K) are not shown.

Each MPR maintains a single bit (or multiple bits) of the state of an instruction from all threads. The number of MPRs corresponds to the number of bits required to store the entire state of an instruction in the specific pipeline stage.

For each pipeline stage, an MPR stores the state of the instructions from all threads. Thus, in the case of a thread switch (controlled by control unit 20), there is no need to flush all subsequent instructions. The processor 12 saves the state of each instruction from the switched thread in the relevant MPR in each pipeline stage, while handling the operation of the long latency instruction in the background. Instructions from the new active thread are inserted into the pipeline from the MPR, creating a continuous flow of instructions within the pipeline. When no thread switching is required, the pipeline operates as a regular pipeline and each MPR operates as a conventional pipeline register. FIG. 1 illustrates the MPRs as including four levels 41-44—one level per thread (thread 4, thread 3, thread 2 and thread 1). These layers (41-44) may be physical layers or differ from physical layers. Thus allowing the processor to execute a thread (active thread) of instructions while storing the status of four other (inactive) threads of instructions. It is noted that the number of threads that can be stored by the processor 12 can differ from 4, and may exceed four.

FIG. 1 also illustrates (see for example dashed arrow 51(2)) the storage of the state of a previously active thread of instructions to layer 43 of the MPRs and the retrieval of the state of the new active thread (see for example dashed arrow 52(2)) that was previously stored at layer 43 to the pipeline stages.

Figure 7:
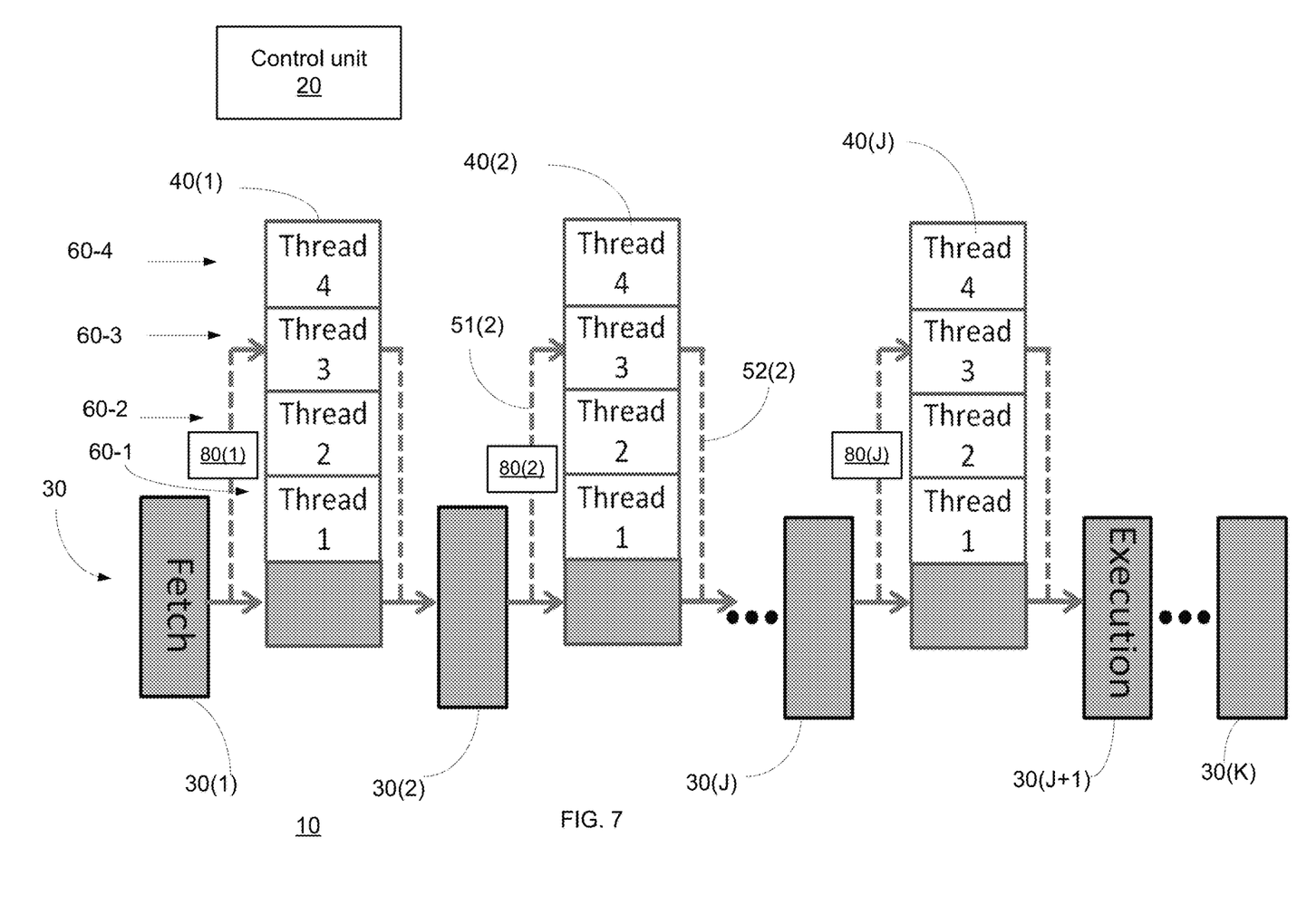
FIG. 7 illustrates a device according to an embodiment of the invention.

FIG. 7 differs from FIG. 1 by showing intermediate buffers 80(1)-80(J) that store the state of the previously active thread of instructions before that state is stored at the appropriate layer of the MPR.

It is noted that although FIGS. 1 and 7 show that the status of new active thread of instructions is retrieved from the same layer that is used to store the state of the previously active thread of instructions—but this is not necessarily so-especially if at a given moment there are multiple vacant layers. Thus—the status of a new active thread of instructions is retrieved from the layer that differs from a layer that is used to store the state of the previously active thread of instructions.

When the long latency instruction is completed, the result is written directly into the MPR in the background. In CFMT, the thread switch penalty is determined by the time required to change the active thread in the MPR, i.e., the time required to read the state of the new, previously inactive thread from the MPR. For a fast MPR, the thread switch penalty is significantly lower than in conventional SOE MT and the performance therefore increases significantly.

Multi-State Pipeline Register (MPR)

Figure 2:
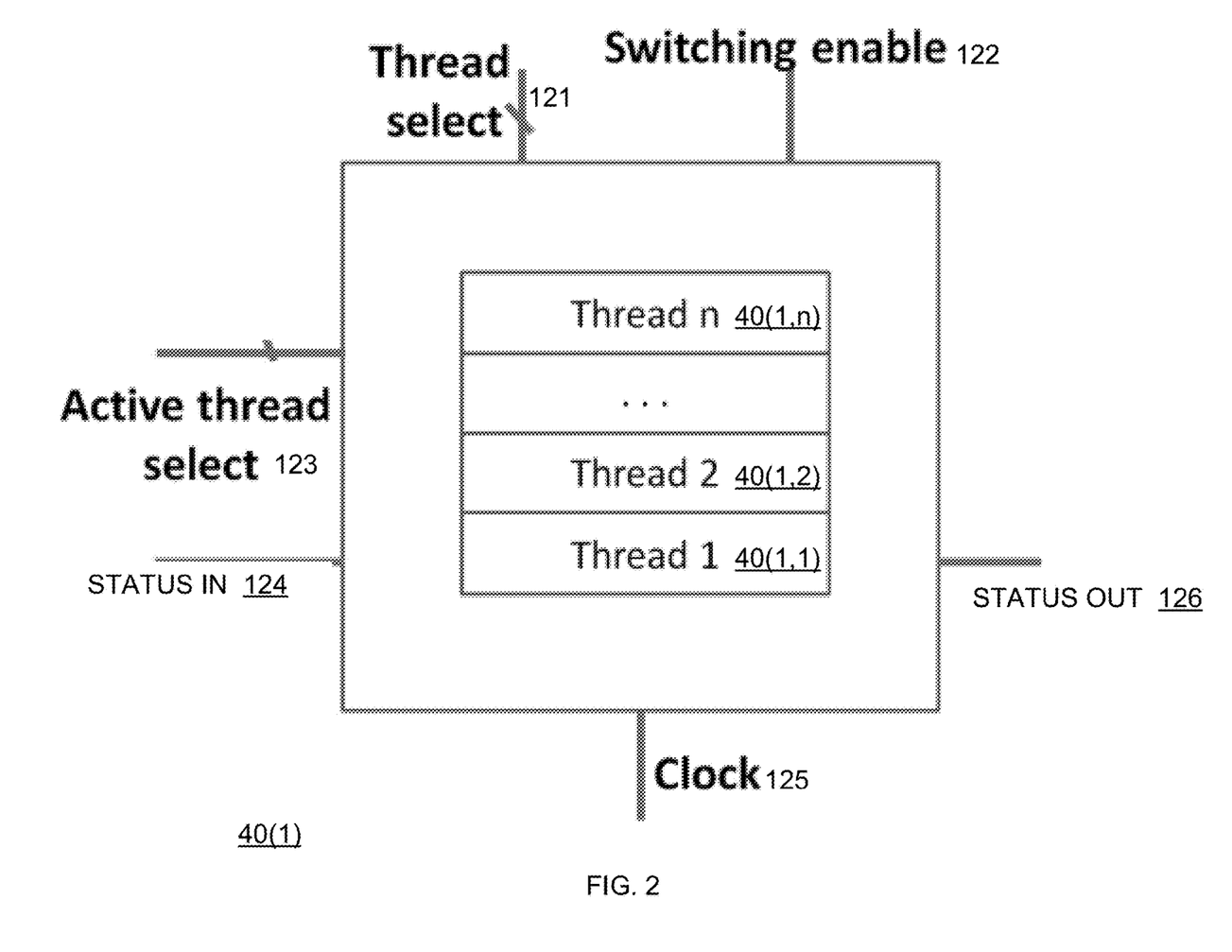
FIG. 2 illustrates a register of the device of FIG. 1 according to an embodiment of the invention.

The logic structure of a multistate pipeline register (MPR) is shown in FIG. 2.

FIG. 2 illustrates the logic structure of a multistate pipeline register (MPR) 40(1) according to an embodiment of the invention. MPR 40(1) includes multiple layers 40(1, 1)-40(1, n) for storing the state of pipeline stage 30(1) for each thread out of up to n threads of instructions.

An MPR maintains a single bit (or multiple bits) of the state of an instruction from all threads (stores a multiple integer of n bits of data), where only one thread is active at a time. The MPR is synchronized by the processor clock (125) and can switch the active thread in response to a reception of a switching enable 122 trigger.

Each MPR stores data (status) for multiple threads, one or more bit per thread. The total size of an MPR is therefore a multiple integer of n bits, where n is the maximum number of threads. For each pipeline stage, the state of the thread of instructions is stored in a set of MPRs with common control signals for thread management and switching. The MPR has one active thread (the current thread) for which the data can be read and written during operation of the processor, as in a regular pipeline register. During a thread switch, the active thread changes (as indicated by active tread select signal 123) while the state of the previously active thread (thread select 121 indicates where to store the previously active thread) is maintained in the MPR. The data (status) is received via status in port 124 and is outputted via status out port 126. The MPR can therefore store data for all threads running in the machine. The time required to change the active thread in the MPR depends on the specific circuit structure of the MPR. This time determines the thread switch penalty of CFMT. A typical thread switch penalty in CMFT is in the range of 1 to 3 clock cycles (or may be even more while being smaller than the penalty associated with SOE MT (typically 8 to 15 clock cycles).

Emerging Memory Technologies

Over the past decade, new technologies have been considered as potential replacements for the traditional SRAM/DRAM-based memory system to overcome scaling issues, such as greater leakage current. These emerging technologies include PCM (Phase Change Memory) [10], PMC (Programmable Metallization Cell, also known as CBRAM) [11], FeRAM (Ferroelectric RAM) [12], RRAM (Resistive RAM) [9], and STT-MRAM (Spin Transfer Torque Magnetoresistive RAM) [13].

While the physical mechanism for these emerging memory technologies is different, all of these technologies are nonvolatile with varying resistance and can therefore be considered as memristors [8]. These emerging memory technologies are fabricated by introducing a special insulator layer between two layers of metal which can be integrated into a CMOS process, stacked vertically in multilayer metal structures physically above the active silicon transistors. This fabrication technique provides a high density of memory bits above a small area of active silicon. Memristive memory cell sizes are approximately 1 to 4 $F^2$ for RRAM and 8 to 45 $F^2$ for STT-MRAM, as compared to SRAM (60 to 175 $F^2$) and DRAM (4 to 15 $F^2$) [14], where F is the minimum feature size in the technology.

RRAM and STT-MRAM are both relatively fast [15]. STT-MRAM does not exhibit any endurance issues, while it is believed that the endurance issue of RRAM will be overcome in the near future [16]. Since memristors are dense, fast, and power efficient, these devices are attractive for use within the processor as an MPR.

Figure 3:
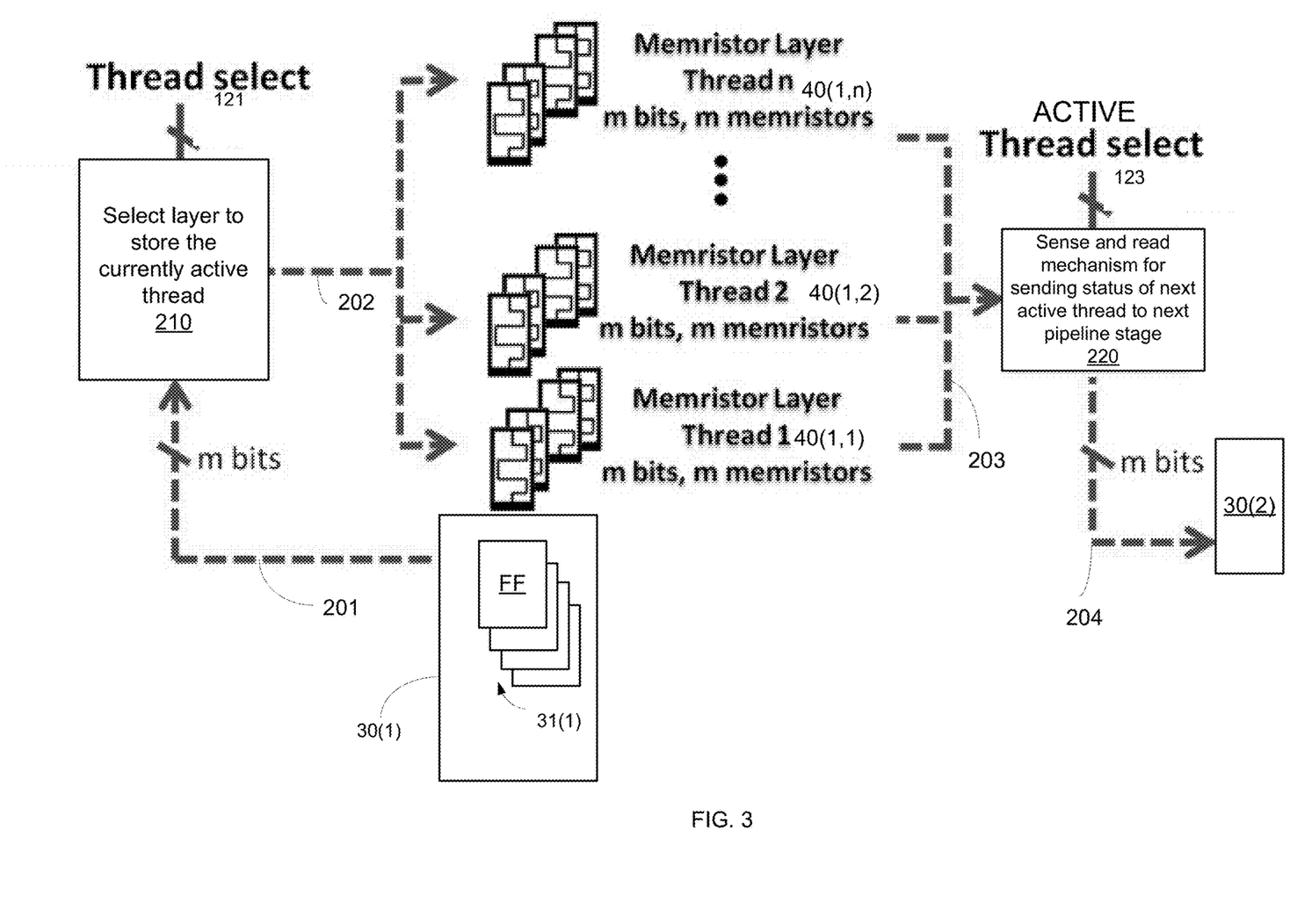
FIG. 3 illustrates a portion of the device of FIG. 1 according to an embodiment of the invention.

FIG. 3 shows multiple layers of memristors 40(1, 1)-40(1, n) that belong to MPR 40(1). Each thread (out of up to n threads) has its own memristor-based layer out of layers 40(1, 1)-40(1, n), where every bit is stored in a single memristor. The active thread is executed by pipeline stage 30(1) and its state may be stored in flip-flops 31(1) of a CMOS layer.

During regular operation of the pipeline, only the CMOS layer is active (blue line) and all memristor-based layers are disabled, exploiting the non-volatility of the memristors to save power.

During a thread switch, the data from the CMOS layer is retrieved (dashed arrow 201) from pipeline stage 30(1), and is (after selecting in response to thread select signal 121—the layer to store the status of the previously active thread—box 210) written into (dashed line 202) to the selected relevant memristor-based layer, while the state of the new active thread (dashed line 202) is sensed and read (220) and transferred (dashed line 204) to the next pipeline stage 30(2).

For a memristor-based MPR, each thread has its own memristor-based layer, while the bottom CMOS layer is used for the active thread running within the pipeline. The bottom layer consists of standard CMOS pipeline registers, compatible with CMOS logic. During a thread switch, data is copied from the CMOS layer to a specific memristor-based layer that corresponds to the previously active thread. The data from the new active thread is read into the next pipeline stage that receives the state of the new thread. When no thread switch occurs, only the bottom CMOS layer is active and the memristor layers are in standby mode. It is possible to completely disable the memristor layers and save power due to the nonvolatility of memristors.

Figure 6:
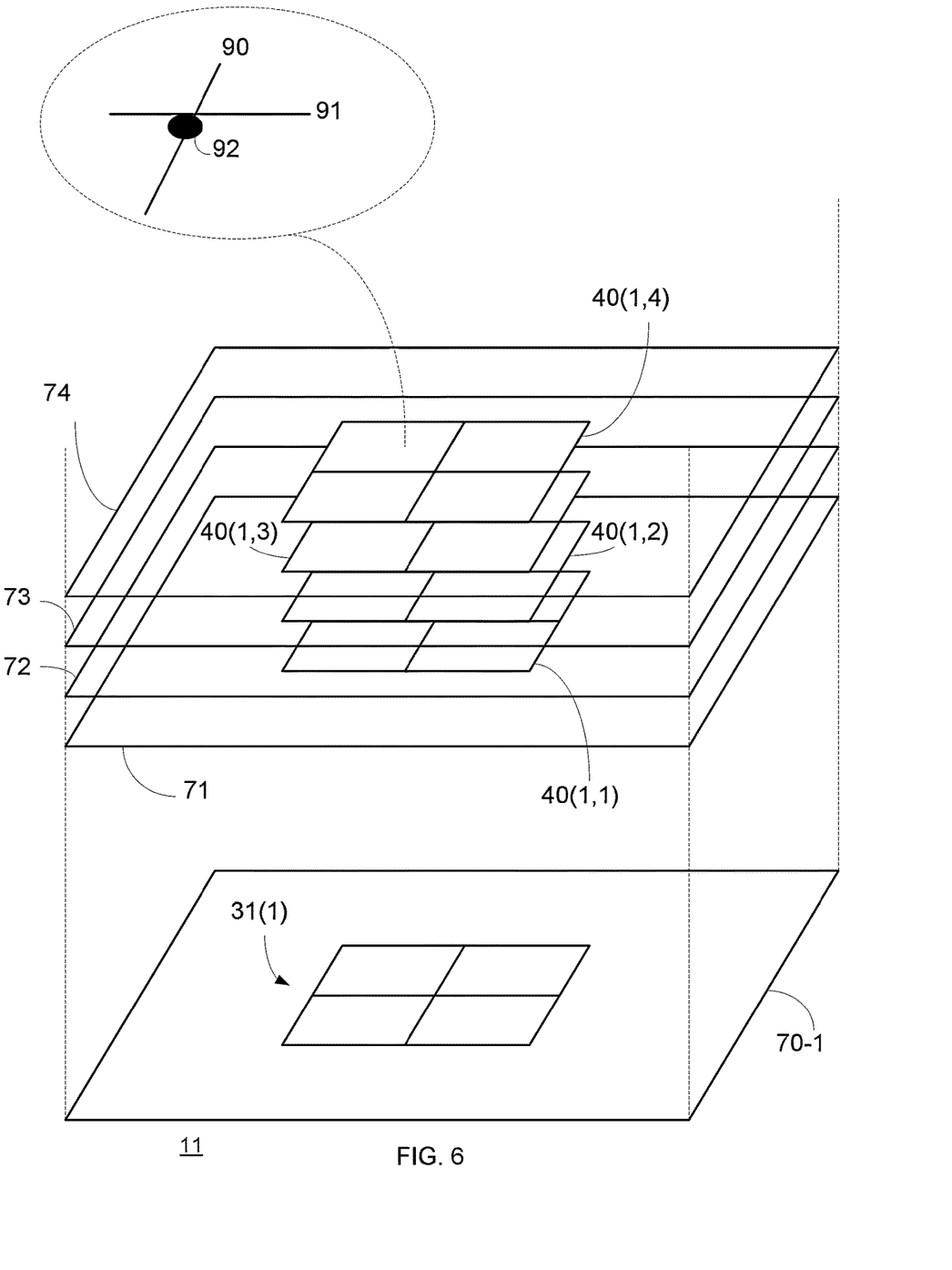
FIG. 6 illustrates a portion of a device according to an embodiment of the invention.

FIG. 6 illustrates a portion 11 of device 10 according to an embodiment of the invention. The portion 11 includes the flip flops 31(1) of pipeline stage 30(1) and layers 40(1,1)-40(1,4) of MPR 40(1). Layers 40(1, 1)-40(1, 4) are implemented in four metal layers 71-74 while flip flops are implemented in a silicone layer 70-1. FIG. 6 shows that layers 40(1,1)-40(1,4) are positioned directly above flip flops 31(1)—and thus the distance between these components is very short—contributing to the very fast retrieval and fetching of status between flip-flops 31(1) and the relevant layer.

FIG. 6 also shows that a memristor of memristor layer 40(1, 4) can include two metal layer conductors 90 and 91 and a memristor interface 92 that connects these two conductors.

To determine the thread switch penalty for a memristor-based MPR, only sensing the memristor layer of the new active thread is considered since the copy operation of the bottom CMOS layer to a memristor layer can be masked using buffers. This latency is determined by the read time of a memristor (sensing the data in the memristive layer). Due to the high density of memristors, our preliminary design of the memristor-based MPR shows that the area overhead can be neglected (less than 0.1% of the pipeline area for 16 active threads). This overhead is primarily due to the write mechanism and can be further optimized by separating the read and write mechanisms.

Performance Analysis

Figure 4A:
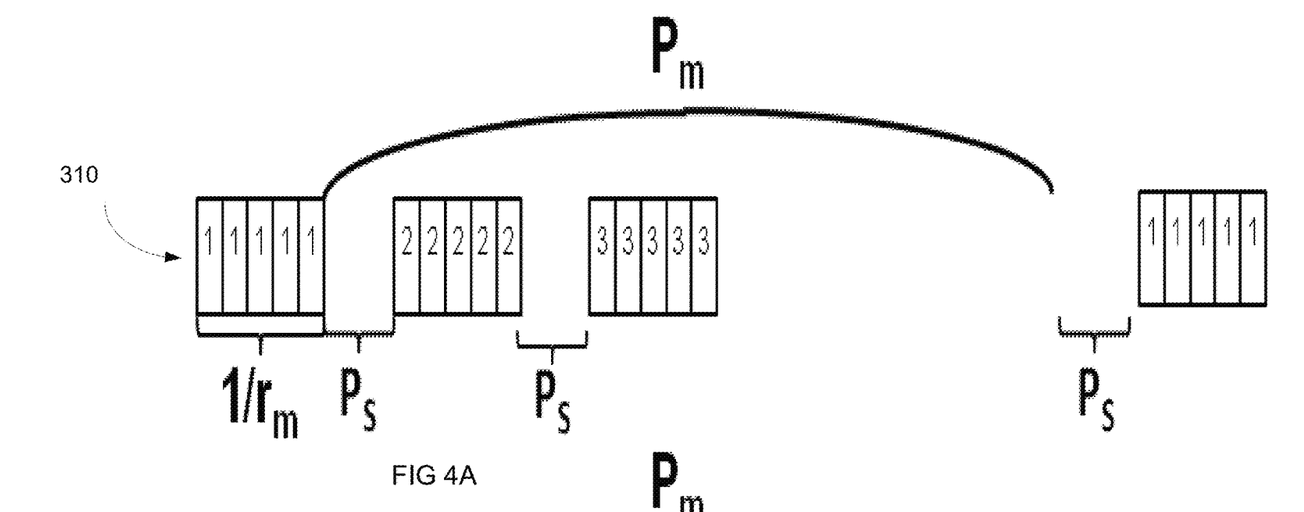
FIG. 4A and FIG. 4B illustrate an execution of instructions according to an embodiment of the invention.

The performance (in CPI—cycles per instruction) of an SoE processor depends upon whether the number of threads is sufficient to overlap long latency events. Two regions of operation exist in SoE processors, depending upon the number of threads running in the machine. The unsaturated region is the region where the number of threads is fewer than the number required for concealing a long latency event. The behavior of the pipeline in this region is illustrated in FIG. 4a. The analytic model assumes that the execution behavior in the pipeline is periodic. The period is determined by the execution of $1/r_m$ instructions (for example five instructions) from the same thread, where $r_m$ is the average fraction of memory operations in the instruction stream. One instruction is a long latency instruction (i.e., the instruction that triggers the thread switch; in this paper, an L1 cache miss is assumed as the trigger, with a miss penalty of $P_m$ cycles) and the remaining instructions are low latency instructions with an average CPI of $CPI_{ideal}$. During execution of the long latency instruction, other instructions from different threads run within the machine. For these instructions, a periodic behavior is again assumed which also triggers a thread switch. For the unsaturated region, it is assumed that there is an insufficient number of instructions to overlap the $P_m$ cycles required to execute the long latency instruction. The CPI in the unsaturated region is $$CPI_{unsat} = \frac{CPI_{ideal} + P_m \cdot r_m \cdot MR(n)}{n},$$

(1) where n is the number of threads running in the machine and MR(n) is the miss rate of the L1 cache. Note that $CPI_{unsat}$ is limited by $CPI_{sat}$, determined in (2).

Figure 4B:
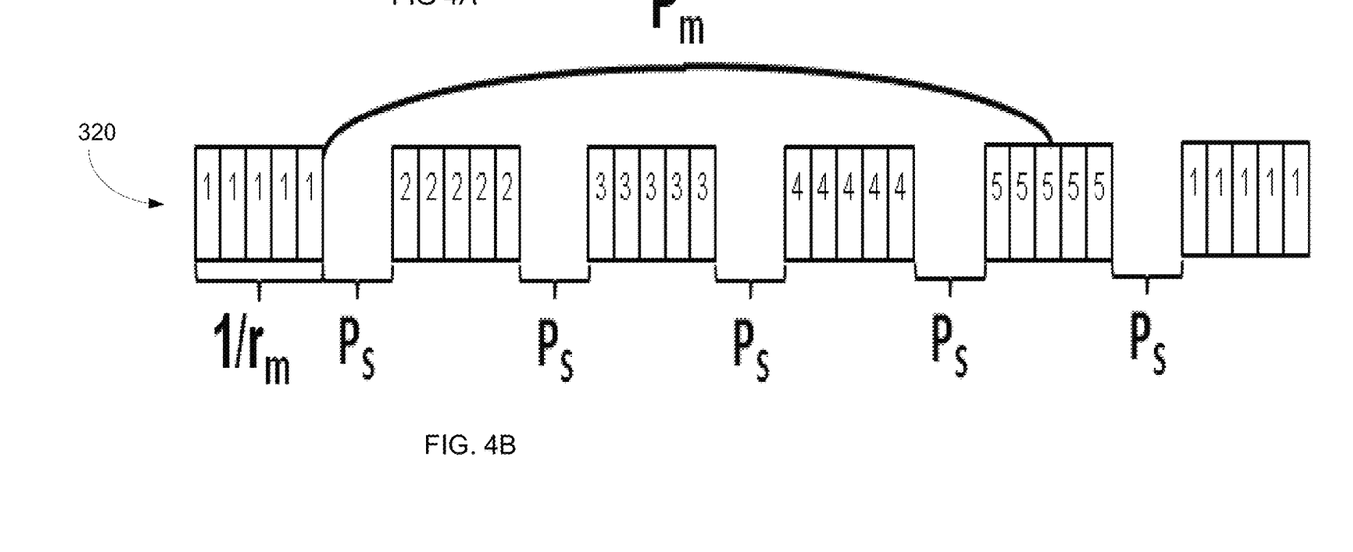

When a sufficient number of threads runs on the machine, the long latency instruction can be completely overlapped, and a second region, named the saturation region, is reached. In the saturation region, the thread switch penalty ($P_s$ clock cycles) influences the behavior, which effectively limits the number of threads (above a specific number of threads there is no change in performance). The behavior of the pipeline in the saturation region is illustrated in FIG. 4b. Assume all of the threads exhibit the same average behavior and $P_m \gg CPI_{ideal}/r_m$ (i.e., the miss penalty is significantly longer than the execution time of the short latency instructions).

In both FIGS. 4a and 4b each box (310 in FIG. 4A and 320 in FIG. 4B) is an instruction. The numbers indicate the thread number. Thus the five first instructions belong to thread 1, the second five instructions belong to thread 2, the third five instructions belong to thread 3, the fourth five instructions belong to thread 4 and the fifth five instructions belong to thread 5.

The CPI in the saturation region is $$CPI_{sat} = CPI_{ideal} + P_s \cdot r_m \cdot MR(n) \qquad (2)$$

In a conventional SOE MT, the switch penalty $P_s$ is determined by the number of instructions flushed during each switch. In CFMT, however, the switch penalty is the MPR read time $T_m$, i.e., the time required to read the state from the MPR and transfer this state to the next pipeline stage. In the case of a memristor-based MPR, the switch penalty is the time required to read the data from the memristor layer. From (2), if the value of $T_m$ is lower than $P_s$, the performance of the processor in the saturation region is significantly improved, where the speedup is $$Speedup_{sat} = 1 + \frac{r_m \cdot MR(n)}{CPI_{ideal} + T_m \cdot r_m \cdot MR(n)} \cdot (P_s - T_m). \qquad (3)$$

Figure 5:
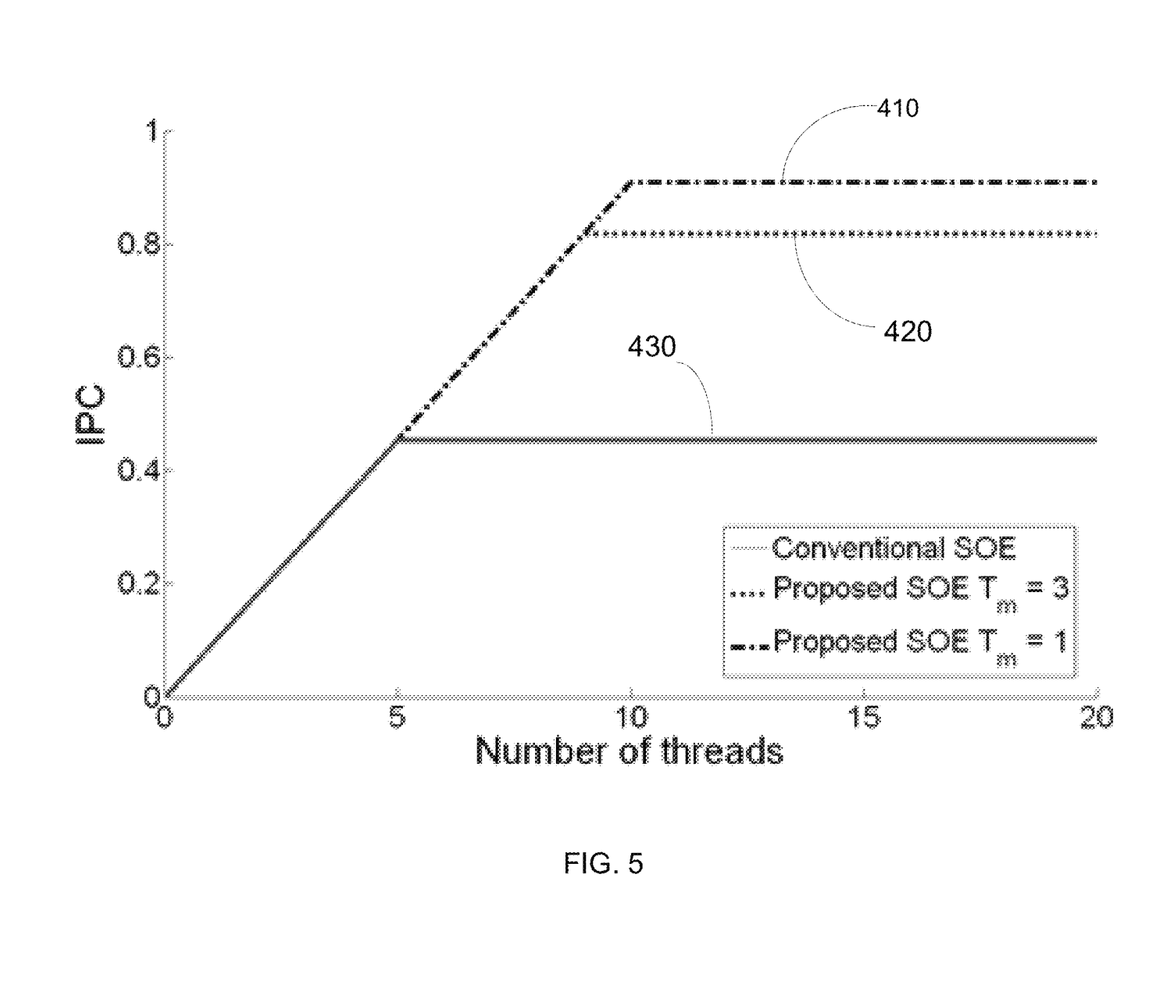
FIG. 5 illustrates a comparison between the performance of a device according to an embodiment of the invention and a prior art device.

Note that in the unsaturated region, the exact CPI of the CFMT is slightly better (lower) than a conventional SoE MT processor due to the improved switch penalty. The Instruction per cycle (IPC, wherein IPC=1/CPI) of the proposed machine as compared to a conventional SoE machine is shown in FIG. 5.

The IPC of the Continuous Flow MT (CFMT) (curves 410 and 420) as compared to a conventional SoE MT processor (curve 430). The memristor read time, which determines the thread switch penalty, is three clock cycles and one clock cycles. The IPC of CFMT is twice greater (2× improvement) than a conventional SOE MT for $T_m=1$ cycle for a constant miss rate, MR=0.25, $r_m$=0.25, $P_s$=20 cycles, and $P_m$=200 cycles.

The performance of the proposed machine exhibits a 2× performance improvement for a constant miss rate when operating in the saturation region. For varying miss rates (particularly with large $P_m$), the behavior of the CPI is similar to the behavior reported in [17]. Preliminary simulations have been performed on GEMS [21], exhibiting a saturation performance improvement of approximately 50% for the SPEC MCF benchmark [22].

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

Figure 8:
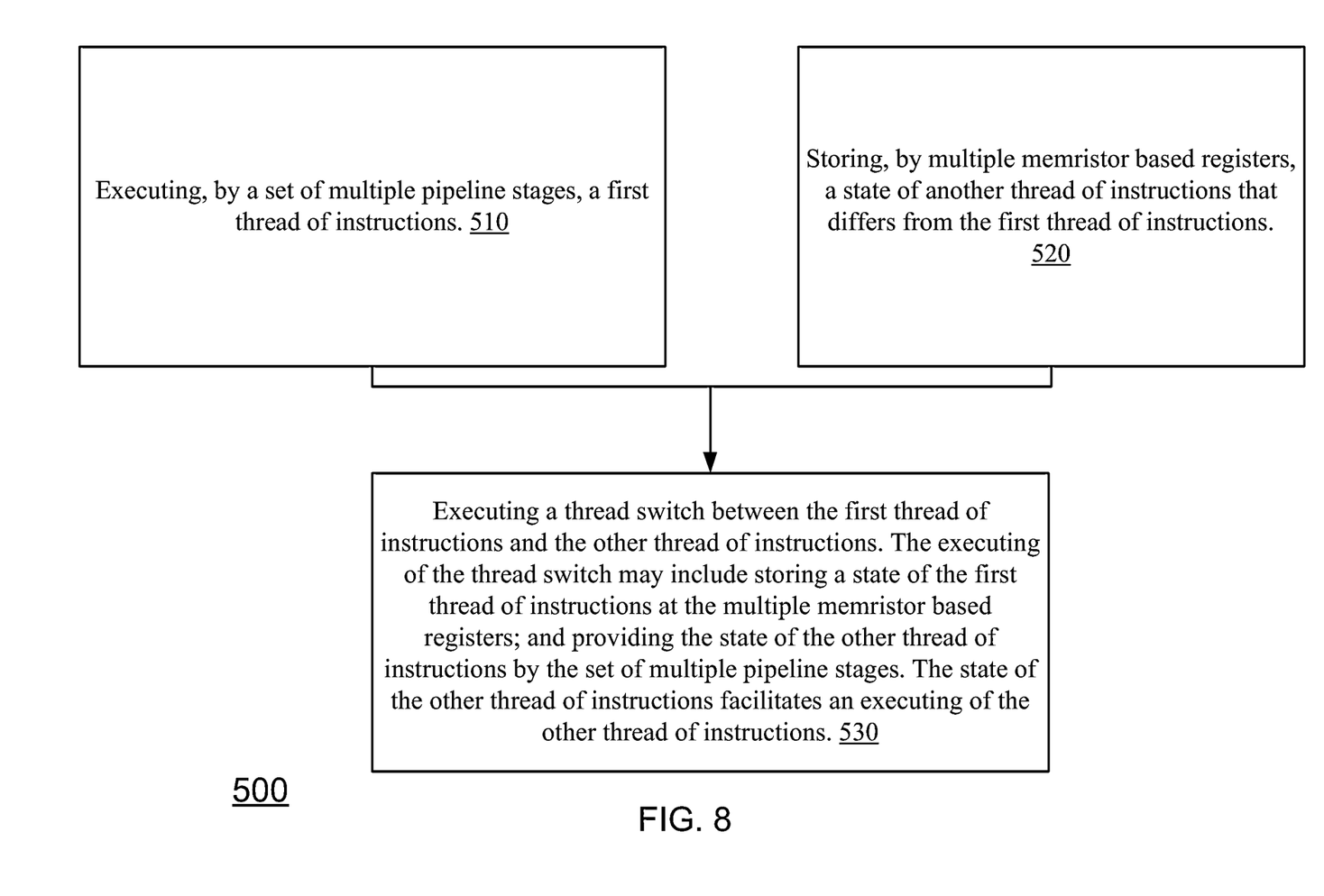
FIG. 8 illustrates a method according to an embodiment of the invention.

FIG. 8 illustrates method 50 according to an embodiment of the invention.

Method 500 may start by stages 510 and 520.

Stage 510 may include executing, by a set of multiple pipeline stages, a first thread of instructions.

Stage 520 may include storing, by multiple memristor based registers, a state of another thread of instructions that differs from the first thread of instructions.

Stage 520 may include:
a. Storing by the multiple memristor based registers a state of each one out of multiple other thread of instructions that differ from the first thread of instructions.
b. Storing by each layer a status of a single other thread of instructions.
c. Storing each other thread of instructions is in a memristive-based layer of the memristor based registers.

Stage 510 and 520 may be followed by stage 530 of executing a thread switch between the first thread of instructions and the other thread of instructions. The executing of the thread switch may include storing a state of the first thread of instructions at the multiple memristor based registers; and providing the state of the other thread of instructions by the set of multiple pipeline stages. The state of the other thread of instructions facilitates an executing of the other thread of instructions. The memristor based registers may include spin torque transfer magnetoresistive memory elements or resistive memory elements.

Stage 530 is followed by stage 510 and 520 wherein the other thread of instructions (that state of which was fed to the pipeline stages) becomes the first thread (or active thread) of instructions and the previously active thread (previously first thread) becomes an inactive thread (another thread).

Stage 530 may include extracting the state of the first thread of instructions from the set of multiple pipeline stages. The aggregate duration of the extracting of the state of the first thread of instructions and the storing of the state of the first thread of instructions may exceed a duration of the provision of the state of the other thread of instructions.

Stage 530 may include executing a thread switch between any thread of instructions out of the first thread of instructions and the multiple other threads of instructions.

Stage 910 may be followed by stage

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A device that comprises:
a set of multiple pipeline stages, wherein the set of multiple pipeline stages is arranged to execute a first thread of instructions;
multiple memristor based registers that are arranged to store a state of another thread of instructions that differs from the first thread of instructions;
a control circuit that is arranged to control a thread switch between the first thread of instructions and the other thread of instructions by controlling a storage of a state of the first thread of instructions at the multiple memristor based registers and by controlling a provision of the state of the other thread of instructions by the set of multiple pipeline stages;
wherein the set of multiple pipeline stages is arranged to execute the other thread of instructions upon a reception of the state of the other thread of instructions;
wherein the memristor based registers comprise resistive memory elements; and
wherein the resistive memory elements are positioned directly above portions of the set of multiple pipeline stages.

2. A device that comprises:
a set of multiple pipeline stages, wherein the set of multiple pipeline stages is arranged to execute a first thread of instructions;
multiple memristor based registers that are arranged to store a state of another thread of instructions that differs from the first thread of instructions;
a control circuit that is arranged to control a thread switch between the first thread of instructions and the other thread of instructions by controlling a storage of a state of the first thread of instructions at the multiple memristor based registers and by controlling a provision of the state of the other thread of instructions by the set of multiple pipeline stages;
wherein the set of multiple pipeline stages is arranged to execute the other thread of instructions upon a reception of the state of the other thread of instructions;
wherein the multiple memristor based registers are arranged to store a state of each thread of instructions out of multiple other threads of instructions that differ from the first thread of instructions;
wherein the control circuit is arranged to control thread switches between any instructions out of the first thread of instructions and any one of the other threads of instructions; and
wherein the multiple memristor based registers comprises multiple layers, wherein each layer is dedicated for storing the status of a single other thread of instructions.

3. A method, comprising:
executing, by a set of multiple pipeline stages, a first thread of instructions; storing, by multiple memristor based registers, a state of another thread of instructions that differs from the first thread of instructions; and executing a thread switch between the first thread of instructions and the other thread of instructions;
wherein the executing of the thread switch comprises:
storing a state of the first thread of instructions at the multiple memristor based registers;
providing the state of the other thread of instructions by the set of multiple pipeline stages;
wherein the state of the other thread of instructions facilitates an executing of the other thread of instructions;
wherein the memristor based registers comprise resistive memory elements; and
wherein the resistive memory elements are positioned directly above portions of the set of multiple pipeline stages.

4. A method, comprising:
executing, by a set of multiple pipeline stages, a first thread of instructions; storing, by multiple memristor based registers, a state of another thread of instructions that differs from the first thread of instructions;
executing a thread switch between the first thread of instructions and the other thread of instructions;
wherein the executing of the thread switch comprises:
storing a state of the first thread of instructions at the multiple memristor based registers;
providing the state of the other thread of instructions by the set of multiple pipeline stages;
wherein the state of the other thread of instructions facilitates an executing of the other thread of instructions;
storing by the multiple memristor based registers a state of each thread of instructions out of multiple other threads of instructions that differ from the first thread of instructions;
wherein the method comprises executing a thread switch between any thread of instructions out of the first thread of instructions and the multiple other threads of instructions; and
wherein the multiple memristor based registers comprises multiple layers, wherein the storing comprise storing by each layer a status of a single other thread of instructions.

* * * * *